US009240358B2

(12) United States Patent
Fujii (10) Patent No.: US 9,240,358 B2
(45) Date of Patent: Jan. 19, 2016

(54) SEMICONDUCTOR DEVICE PROVIDED WITH TEMPERATURE SENSING DIODE AND MANUFACTURING METHOD THEREOF

(71) Applicant: MITSUBISHI ELECTRIC CORPORATION, Tokyo (JP)

(72) Inventor: Hidenori Fujii, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/186,925

(22) Filed: Feb. 21, 2014

(65) Prior Publication Data

US 2014/0353665 A1    Dec. 4, 2014

(30) Foreign Application Priority Data

May 29, 2013    (JP) .................................. 2013-113124

(51) Int. Cl.
| | |
|---|---|
| H01L 29/73 | (2006.01) |
| H01L 21/66 | (2006.01) |
| H01L 21/18 | (2006.01) |
| G01K 7/01 | (2006.01) |
| H01L 29/66 | (2006.01) |
| H01L 29/739 | (2006.01) |
| H01L 27/06 | (2006.01) |
| H01L 27/02 | (2006.01) |

(52) U.S. Cl.
CPC *H01L 22/12* (2013.01); *G01K 7/01* (2013.01); *H01L 21/18* (2013.01); *H01L 27/0255* (2013.01); *H01L 27/0629* (2013.01); *H01L 29/66992* (2013.01); *H01L 29/7397* (2013.01)

(58) Field of Classification Search
CPC .... H01L 22/12; H01L 21/18; H01L 29/66992
See application file for complete search history.

(56) References Cited

U.S. PATENT DOCUMENTS

| | | | |
|---|---|---|---|
| 7,034,345 B2* | 4/2006 | Chang ................... | H01L 25/072 257/131 |
| 2012/0217541 A1* | 8/2012 | Hsieh ................... | H01L 29/7397 257/140 |
| 2014/0368258 A1* | 12/2014 | Willkofer et al. ............. | 327/513 |

FOREIGN PATENT DOCUMENTS

| | | |
|---|---|---|
| JP | Hei09-064404 A | 3/1997 |
| JP | Hei10-294475 A | 11/1998 |
| JP | 2002-190575 A | 7/2002 |
| JP | 2008-235600 A | 10/2008 |
| JP | 2010-258233 A | 11/2010 |
| JP | 2012-195339 A | 10/2012 |
| JP | 2013-033970 A | 2/2013 |
| WO | 2007/092089 A1 | 8/2007 |

OTHER PUBLICATIONS

An Office Action; "Notice of Reasons for Rejection," issued by the Japanese Patent Office on Sep. 8, 2015, which corresponds to Japanese Patent Application No. 2013-113124 and is related to U.S. Appl. No. 14/186,925; with English language partial translation.

* cited by examiner

*Primary Examiner* — Evan Pert
(74) *Attorney, Agent, or Firm* — Studebaker & Brackett PC (57) ABSTRACT

A semiconductor device includes: a semiconductor substrate; a first insulating film on a surface of the semiconductor substrate; a temperature sensing diode on the first insulating film; a trench extending inward from the surface of the semiconductor substrate; and a trench electrode embedded in the trench via a second insulating film and connected to the temperature sensing diode.

14 Claims, 8 Drawing Sheets

FIG. 17

SEMICONDUCTOR DEVICE PROVIDED WITH TEMPERATURE SENSING DIODE AND MANUFACTURING METHOD THEREOF

BACKGROUND OF THE INVENTION

1. Field of the Invention

The present invention relates to a semiconductor device provided with a temperature sensing diode for detecting a temperature of a semiconductor substrate and a manufacturing method thereof.

2. Background Art

In power modules such as IPM (intelligent power modules), a temperature sensing diode made of polysilicon or amorphous silicon is incorporated in an IGBT (insulated gate bipolar transistor) thereof. By monitoring VF characteristics of this temperature sensing diode, an operating temperature thereof is managed and protected.

Conventionally, a thick oxide film is formed on a substrate, polysilicon is formed thereon, and ions are injected, and in this way, a temperature sensing diode having a $p^+$-type layer/$n^-$-type layer/$n^+$-type layer is formed. Therefore, the temperature sensing diode is formed on the thick oxide film and located away from an emitter region which is a heat generating source from the standpoint of layout, resulting in poor sensitivity to temperature inside the semiconductor. On the other hand, a temperature sensing diode is proposed in which p-type and n-type polysilicon are formed in a trench (e.g., see Japanese Patent Laid-Open No. 2013-033970).

SUMMARY OF THE INVENTION

The greater the trench width, the thicker the polysilicon embedded in the trench needs to be, but when the thickness of the polysilicon is 1 μm or more, there are problems associated with processing capability, dirt or the like. For this reason, the trench width or the trench depth needs to be reduced. When the trench width is small, a wide contact area with the upper electrode cannot be secured, and therefore a high current cannot be passed. On the other hand, when the trench depth is small, sensitivity to temperature inside the semiconductor deteriorates.

Making thicker the oxide film of the trench inner wall will improve dielectric strength against ESD (electrostatic discharge), but this prevents the device from withstanding a surge current caused by ESD, resulting in low ESD resistance. The thicker oxide film also deteriorates temperature sensitivity inside the semiconductor.

In view of the above-described problems, an object of the present invention is to provide a semiconductor device which can increase ESD resistance and improve sensitivity to the temperature and a manufacturing method thereof.

According to the present invention, a semiconductor device includes: a semiconductor substrate; a first insulating film on a surface of the semiconductor substrate; a temperature sensing diode on the first insulating film; a trench extending inward from the surface of the semiconductor substrate; and a trench electrode embedded in the trench via a second insulating film and connected to the temperature sensing diode.

The present invention makes it possible to increase ESD resistance and improve sensitivity to the temperature.

Other and further objects, features and advantages of the invention will appear more fully from the following description.

DETAILED DESCRIPTION OF THE PREFERRED EMBODIMENTS

A semiconductor device and a manufacturing method thereof according to the embodiments of the present invention will be described with reference to the drawings. The same components will be denoted by the same symbols, and the repeated description thereof may be omitted.

First Embodiment

Figure 1:
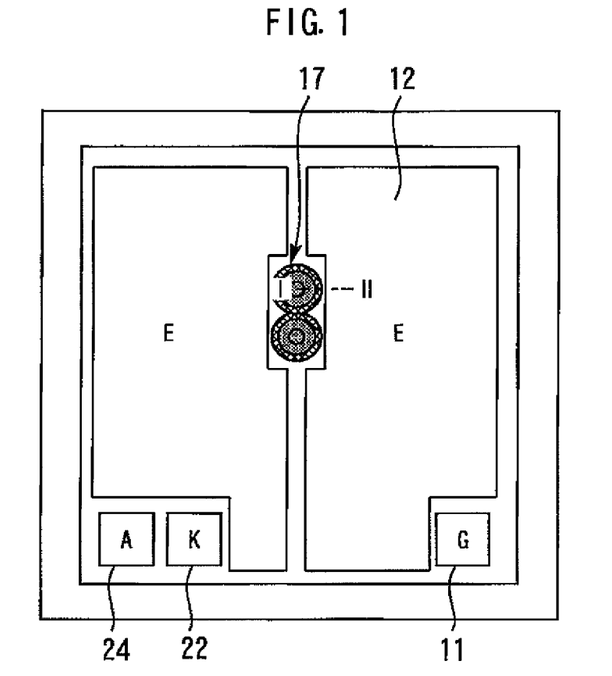
FIG. 1 is a top view illustrating a semiconductor device according to a first embodiment of the present invention.
Figure 2:
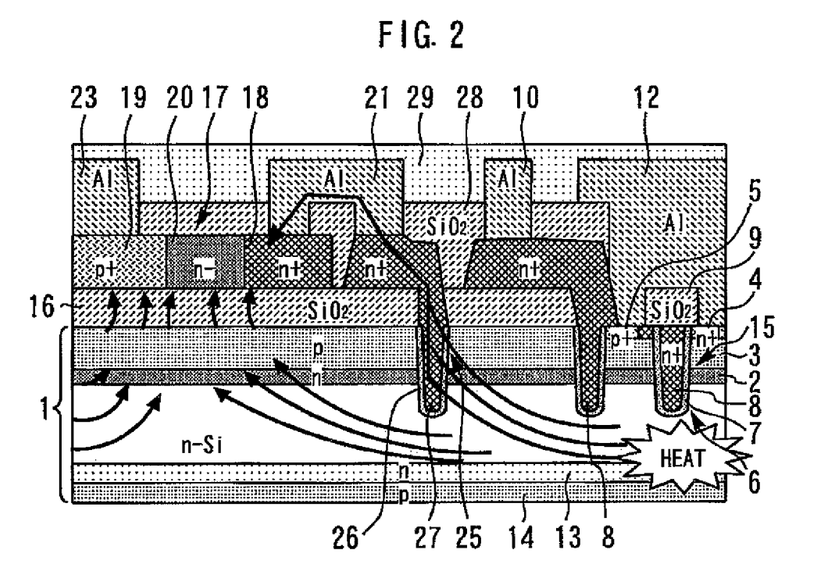
FIG. 2 is a cross-sectional view along I-II in FIG. 1.
Figure 3:
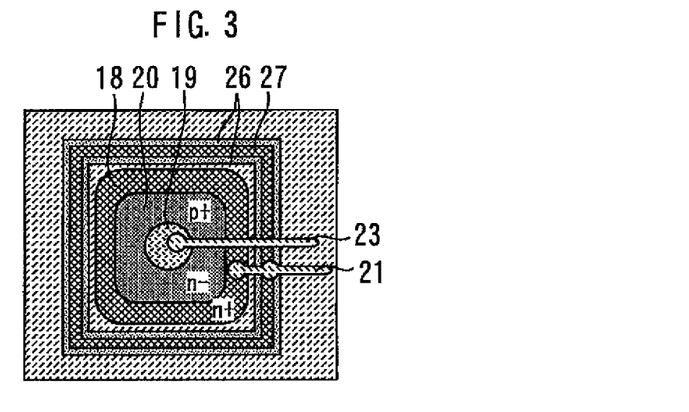
FIG. 3 is a top view illustrating a temperature sensing diode according to the first

FIG. 1 is a top view illustrating a semiconductor device according to a first embodiment of the present invention. FIG. 2 is a cross-sectional view along I-II in FIG. 1. FIG. 3 is a top view illustrating a temperature sensing diode according to the first embodiment of the present invention.

An n-type layer 2 and a p-type base layer 3 are formed in that order on the surface of a semiconductor substrate 1 made of n-type silicon. An $n^+$-type emitter layer 4 and a $p^+$-type contact layer 5 are formed in the p-type base layer 3. A trench 6 is formed on the surface side of the semiconductor substrate 1 and a trench gate 8 made of $n^+$-type polysilicon is formed in the trench 6 via a gate insulating film 7.

An oxide film 9 is formed on the trench gate 8. The trench gate 8 is connected to a gate pad 11 via Al wiring 10. An emitter electrode 12 made of Al is connected to the p+-type contact layer 5. An n-type buffer layer 13 and a p-type collector layer 14 are formed on the back of the semiconductor substrate 1. These components form an IGBT 15 (insulated gate bipolar transistor).

An oxide film 16 made of $SiO_2$ having a thickness of 3000 Å to 10000 Å is formed on the surface of the semiconductor substrate 1. A temperature sensing diode 17 is formed on this oxide film 16. The temperature sensing diode 17 includes an $n^+$-type layer 18, a $p^+$-type layer 19 and an $n^-$-type layer 20 formed concentrically from the center toward the outside. The $n^+$-type layer 18 is connected to a cathode pad 22 via Al wiring 21 and the $p^+$-type layer 19 is connected to an anode pad 24 via Al wiring 23.

A trench 25 that extends inward from the surface of the semiconductor substrate 1 is formed in the vicinity of the IGBT 15. A trench electrode 27 is embedded in the trench 25 via an oxide film 26. The trench electrode 27 is connected to the $n^+$-type layer 18 of the temperature sensing diode 17 via Al wiring 21. The temperature sensing diode 17 and the trench electrode 27 are made of polysilicon or amorphous silicon. The oxide film 26 is thinner than the oxide film 16.

An oxide film 28 is formed so as to cover the temperature sensing diode 17. The oxide film 28 and Al wiring 10, 21 and 23 are covered with a protective film 29. The protective film 29 has a thickness of 2000 Å to 10000 Å, and is an insulating film having a thickness of 2000 Å to 10000 Å and a refractive index of 1.8 to 2.2 laminated on an SInSiN semi-insulating film having a thickness of 2000 Å to 10000 Å and a refractive index of 2.2 to 2.7.

Next, a method for manufacturing a semiconductor device according to the present embodiment will be described. The oxide film 16 is deposited on the semiconductor substrate 1, a polysilicon film having a thickness of 500 Å to 5000 Å is formed, phosphorus or arsenic of 1E12 to 1E14 [$l/cm^2$] is injected over the entire surface to determine the concentration of the $n^-$-type layer 20. A polysilicon film is patterned through a photoengraving process to form a structure of the temperature sensing diode 17.

The semiconductor substrate 1 is etched to a depth of 2 μm to 10 μm to form the trench 25. The oxide film 26 having a thickness of 500 Å to 1500 Å is formed on the inner wall of the trench 25 through thermal oxidation, a polysilicon film having a thickness of 3000 Å to 15000 Å is formed to fill the trench 25 and thereby form the trench electrode 27.

Boron of 1E13 to 1E16 [$l/cm^2$] is injected into the portion of the $p^+$-type layer 19, phosphorus or arsenic of 1E13 to 1E16 [$l/cm^2$] is injected into the portion of the $n^+$-type layer 18 and activated through heat treatment (900° C. to 1200° C., 30 to 120 minutes).

The oxide film 28 having a thickness of 3000 Å to 10000 Å is deposited, the contact portion is opened, and then an Al film having a thickness of 1 μm to 10 μm is formed through vapor deposition or sputtering. The Al film is patterned to form Al wiring 10, 21 and 23. Next, the protective film 29 is formed and the protective film 29 on the emitter electrode 12 and the gate pad 11 or the like where wiring is performed is removed. Finally, the back of the semiconductor substrate 1 is polished to a desired thickness, and the n-type buffer layer 13 and the p-type collector layer 14 are formed on the back of the semiconductor substrate 1 through ion injection and heat treatment.

In the present embodiment, the temperature sensing diode 17 is located not inside the trench but on the semiconductor substrate 1 which is free of structural constraints. For this reason, it is possible to configure the temperature sensing diode 17 having a large area and improve ESD resistance.

While the temperature sensing diode 17 on the oxide film 16 is located apart from the emitter region of the IGBT 15 which is a heat generating source, the trench electrode 27 can be located near the emitter region. By connecting the trench electrode 27 that extends inside the semiconductor substrate 1 to the temperature sensing diode 17, it is possible to improve sensitivity to the internal temperature of the semiconductor substrate 1. Thus, even if the temperature of the IGBT 15 rises drastically due to abnormal operation or the like, this can be instantaneously followed.

Furthermore, the oxide film 26 of the inner wall of the trench 25 has a thickness ½ to ⅓ of that of the oxide film 16 below the temperature sensing diode 17 and has good thermal conduction. Thus, the temperature sensing diode 17 that receives heat via the trench electrode 27 has high response to a temperature change.

Furthermore, since the trench electrode 27 is connected to the $n^+$-type layer 18, it is possible to cause a surge current that instantaneously flows through the temperature sensing diode 17 to escape to the trench electrode 27, thus increasing ESD resistance and allowing high-speed response.

Moreover, the manufacturing cost can be reduced because the temperature sensing diode 17, the trench electrode 27 and the trench gate 8 can be simultaneously formed using the same polysilicon film. Note that doped polysilicon or amorphous silicon may also be used instead of polysilicon.

Figure 4:
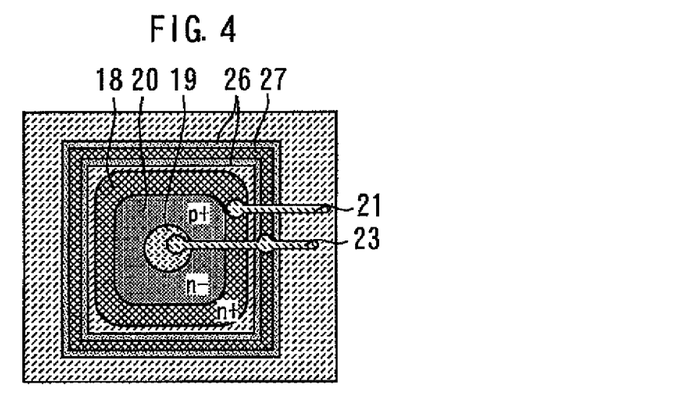
FIG. 4 is a top view illustrating modification example 1 of the temperature sensing diode according to the first embodiment of the present invention.

FIG. 4 is a top view illustrating modification example 1 of the temperature sensing diode according to the first embodiment of the present invention. The trench electrode 27 is connected to the $p^+$-type layer 19. Connecting the trench electrode 27 to the $p^+$-type layer 19 which is farthest from the emitter region improves temperature uniformity within the device and reduces variations in temperature characteristics. Moreover, since temperature can be transmitted to the vicinity of the pn junction, high-speed response is made possible.

Figure 5:
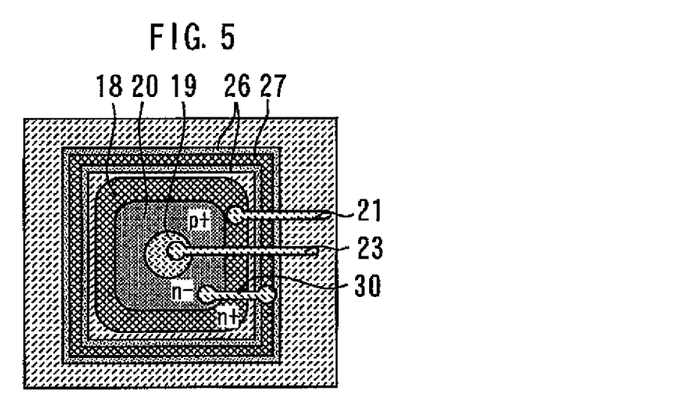
FIG. 5 is a top view illustrating modification example 2 of the temperature sensing diode according to the first embodiment of the present invention.

FIG. 5 is a top view illustrating modification example 2 of the temperature sensing diode according to the first embodiment of the present invention. The trench electrode 27 is connected to the $n^-$-type layer 20 via Al wiring 30. This improves heat dissipation, and thereby allows high-temperature operation as well as high-speed response.

Second Embodiment

Figure 6:
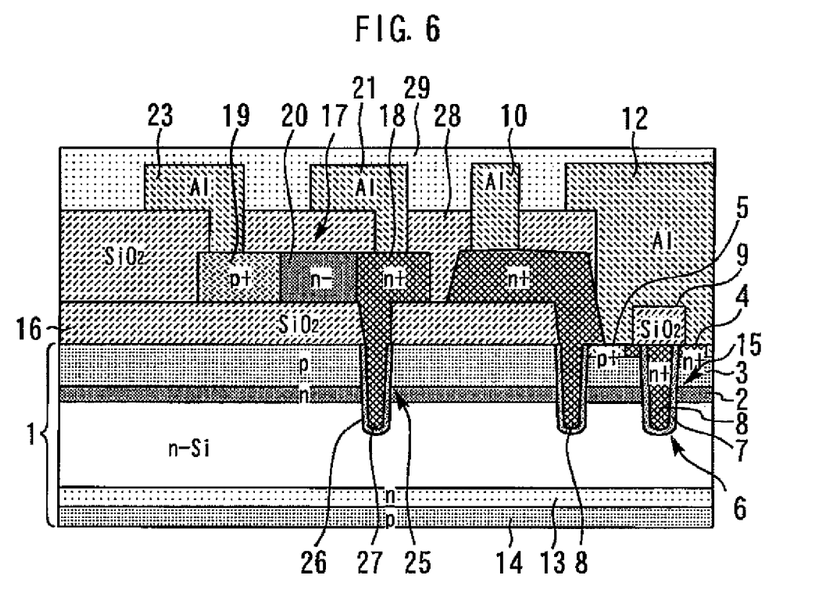
FIG. 6 is a cross-sectional view illustrating a semiconductor device according to a second embodiment of the present invention.

FIG. 6 is a cross-sectional view illustrating a semiconductor device according to a second embodiment of the present invention. The trench electrode 27 is located directly underneath the $n^+$-type layer 18 and formed integrally with the $n^+$-type layer 18. This facilitates heat transmission and improves high-speed response. This can also cause a surge current that instantaneously flows through the temperature sensing diode 17 to escape to the trench electrode 27, and thereby improves ESD resistance.

Figure 7:
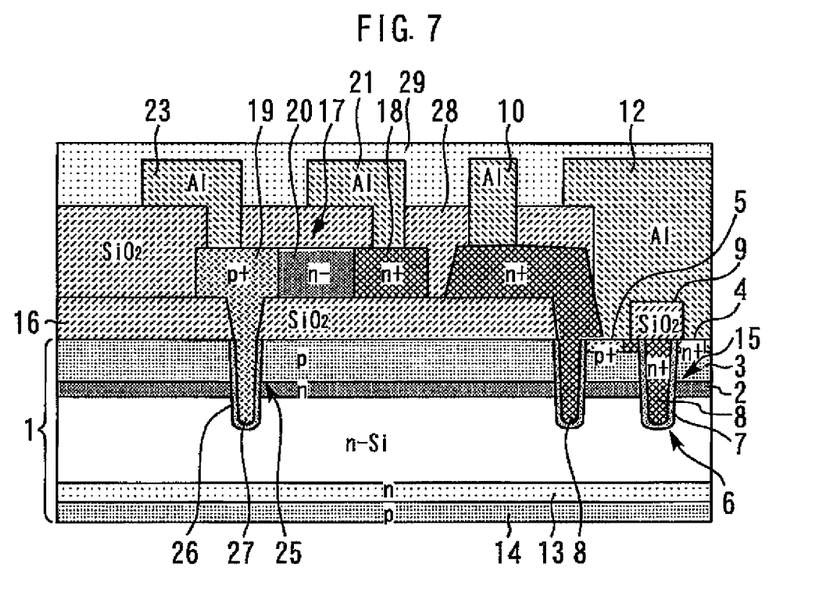
FIG. 7 is a cross-sectional view illustrating modification example 1 of the semiconductor device according to the second embodiment of the present invention.
Figure 8:
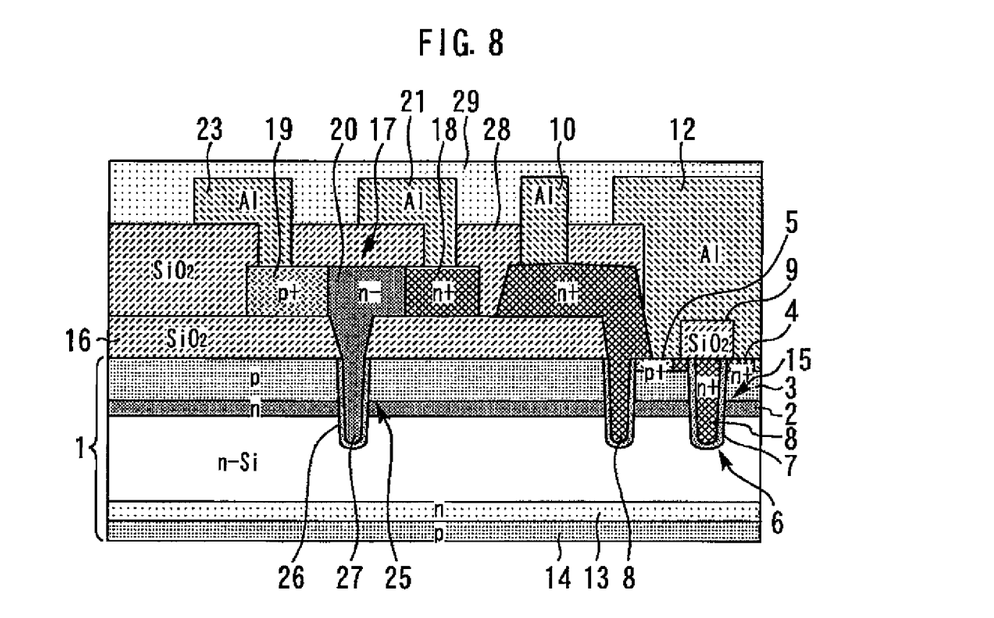
FIG. 8 is a cross-sectional view illustrating modification example 2 of the semiconductor device according to the second embodiment of the present invention.

FIG. 7 is a cross-sectional view illustrating modification example 1 of the semiconductor device according to the second embodiment of the present invention. The trench electrode 27 is located directly underneath the $p^+$-type layer 19 and formed integrally with the $p^+$-type layer 19. FIG. 8 is a cross-sectional view illustrating modification example 2 of the semiconductor device according to the second embodiment of the present invention. The trench electrode 27 is located directly underneath the $n^-$-type layer 20 and formed integrally with the $n^-$-type layer 20.

Figure 9:
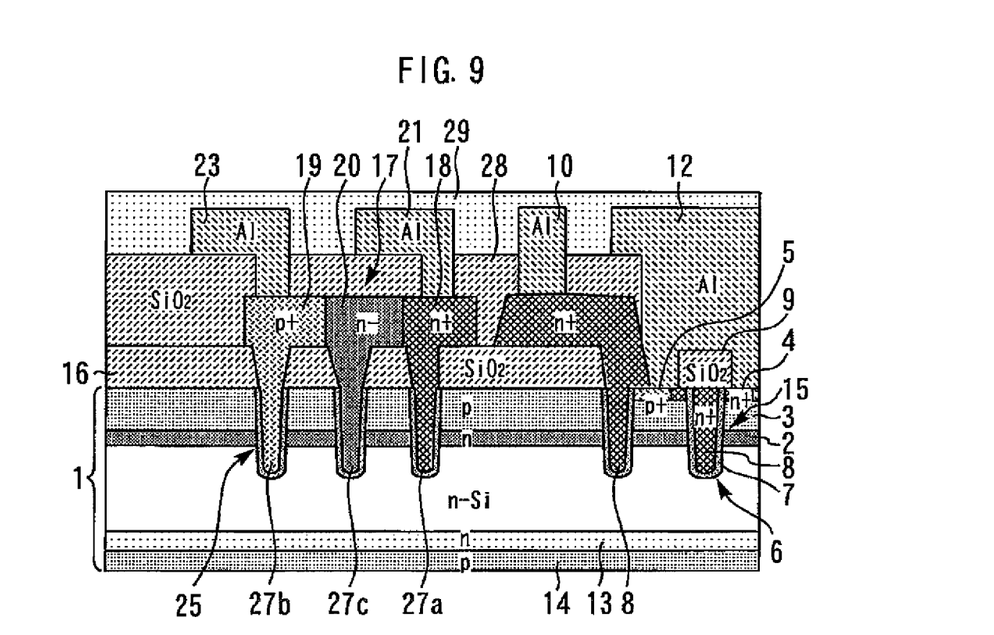
FIG. 9 is a cross-sectional view illustrating modification example 3 of the semiconductor device according to the second embodiment of the present invention.

FIG. 9 is a cross-sectional view illustrating modification example 3 of the semiconductor device according to the second embodiment of the present invention. The trench electrode 27 includes a first trench electrode 27a formed integrally with the $n^+$-type layer 18, a second trench electrode 27b formed integrally with the $p^+$-type layer 19 and a third trench electrode 27c formed integrally with the n⁻-type layer 20. In these modification examples 1 to 3, high-speed response improves, the manufacturing cost can be reduced and ESD resistance increases as in the case of the second embodiment shown in FIG. 6.

Third Embodiment

Figure 10:
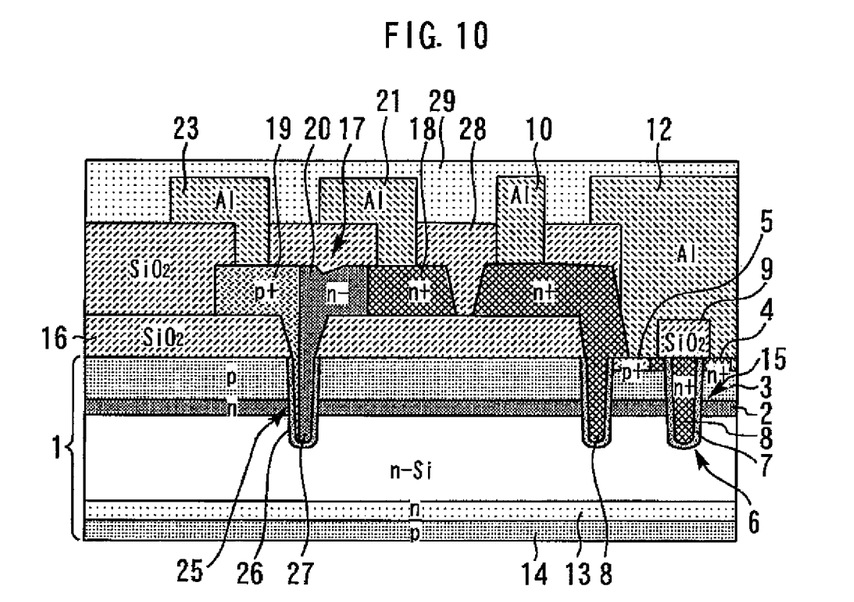
FIG. 10 is a cross-sectional view illustrating a semiconductor device according to a third embodiment of the present invention.

FIG. 10 is a cross-sectional view illustrating a semiconductor device according to a third embodiment of the present invention. The trench electrode 27 is located directly underneath a p⁺n⁻ junction between the p⁺-type layer 19 and the n⁻-type layer 20. The p⁺n⁻ junction extends into the trench electrode 27.

Next, a method of manufacturing a semiconductor device according to the present embodiment will be described with reference to the accompanying drawings. FIGS. 11 to 14 are cross-sectional views illustrating the method of manufacturing a semiconductor device according to the third embodiment of the present invention.

Figure 11:
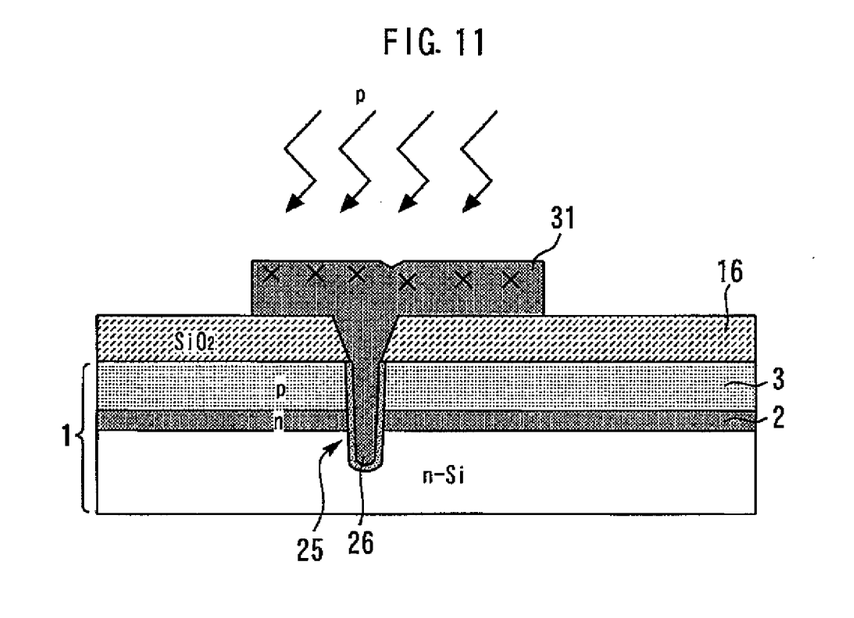
FIGS. 11 to 14 are cross-sectional views illustrating the method of manufacturing a semiconductor device according to the third embodiment of the present invention.

First, as shown in FIG. 11, the oxide film 16 is formed on the surface of the semiconductor substrate 1. The trench 25 that passes through the oxide film 16 and extends from the surface to the interior of the semiconductor substrate 1 is formed. A polysilicon film 31 is formed on the oxide film 16 and in the trench 25 via the oxide film 26. Boron of 1E13 to 1E16 [l/cm²] is injected into the polysilicon film 31 and heat treatment is performed to form the n⁻-type layer 20.

Figure 12:
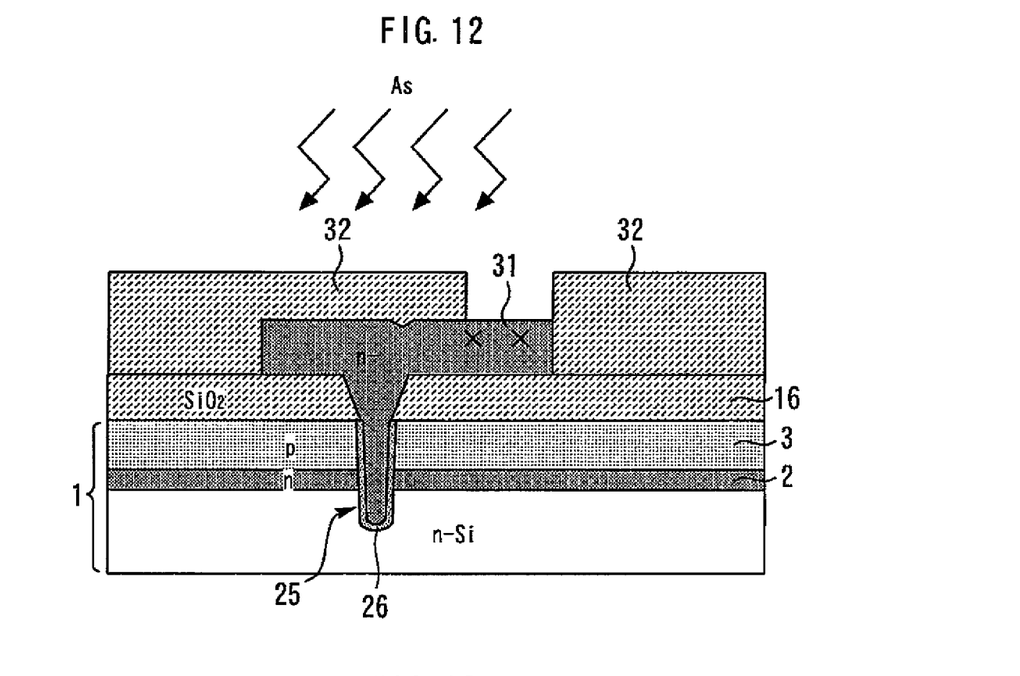

Next, as shown in FIG. 12, the polysilicon film 31 is covered with an oxide film 32 and an opening is formed in the oxide film 32. Using this oxide film 32 as a mask, phosphorus or arsenic of 1E13 to 1E16 [l/cm²] is injected into part of the polysilicon film 31 and heat treatment is performed to form the n⁺-type layer 18.

Figure 13:
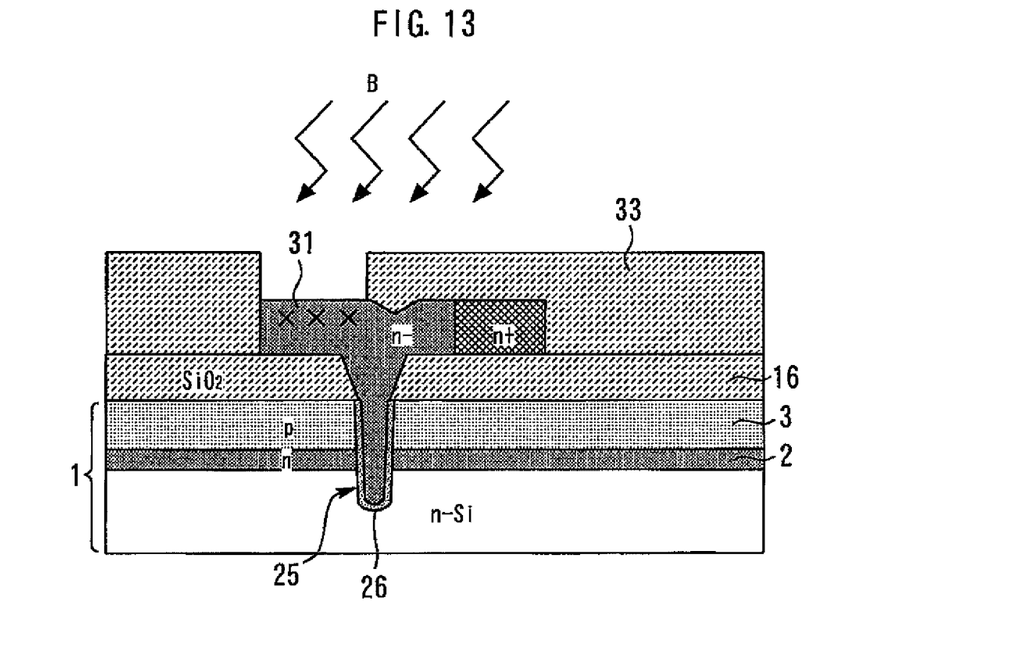

Next, as shown in FIG. 13, the left side of the polysilicon film 31 with respect to the trench 25 is exposed while the right side is covered with an oxide film 33. Using this oxide film 33 as a mask, phosphor or arsenic of 1E13 to 1E16 [l/cm²] is injected into the left side of the polysilicon film 31.

Figure 14:
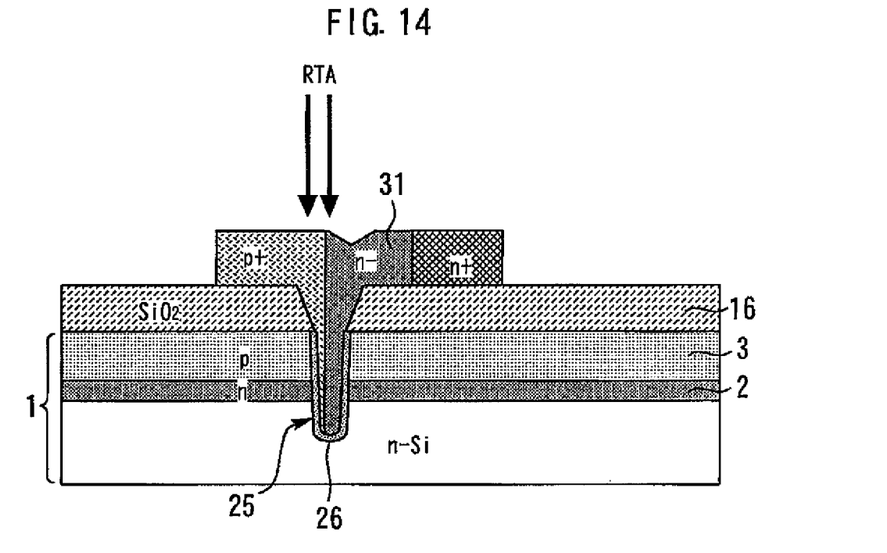

Next, as shown in FIG. 14, the portion of the polysilicon film 31 in the trench 25 is locally subjected to RTA (rapid thermal annealing) treatment to cause impurity to diffuse in the depth direction of the trench 25 and form a p⁺n⁻ junction. Examples of RTA treatment include laser annealing, electron beam annealing, lamp annealing and pulse lamp annealing. The temperature for RTA treatment ranges 650 to 950° C. and power of RTA treatment is optional.

Since the polysilicon film 31 is thin, electric field concentration is likely to occur. In the present embodiment, however, since the p⁺n⁻ junction extends into the trench electrode 27, it is possible to increase the cross-sectional area in a small space. For this reason, ESD resistance increases. Furthermore, since heat dissipation improves, it is possible to realize a high-temperature operation as well as high-speed response.

In normal RTA treatment, impurity is diffused over entire polysilicon, but locally applying RTA treatment makes it possible to cause impurity to be diffused only in the depth direction and form a pn junction of a large cross-sectional area. Adjusting conditions such as the duration and power of RTA treatment makes it possible to adjust the depth of diffusion, that is, the area of junction and accurately adjust characteristics.

Figure 15:
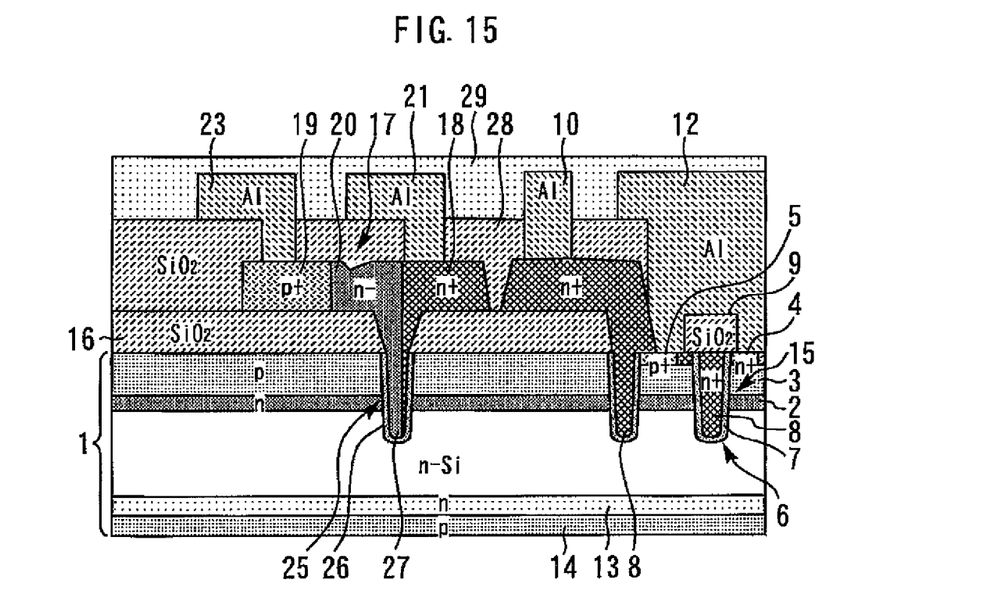
FIG. 15 is a cross-sectional view illustrating modification example 1 of the semiconductor device according to the third embodiment of the present invention.

FIG. 15 is a cross-sectional view illustrating modification example 1 of the semiconductor device according to the third embodiment of the present invention. The trench electrode 27 is located directly underneath an n⁻n⁺ junction between the n⁻-type layer 20 and the n⁺-type layer 18, and the n⁻n⁺ junction extends into the trench electrode 27. Since the polysilicon film 31 is thin, electric field concentration is likely to occur. In the present embodiment, however, since the n⁻n⁺ junction extends into the trench electrode 27, it is possible to increase the cross-sectional area in a small space. For this reason, ESD resistance increases. Furthermore, since heat dissipation improves, it is possible to realize a high-temperature operation as well as high-speed response.

Figure 16:
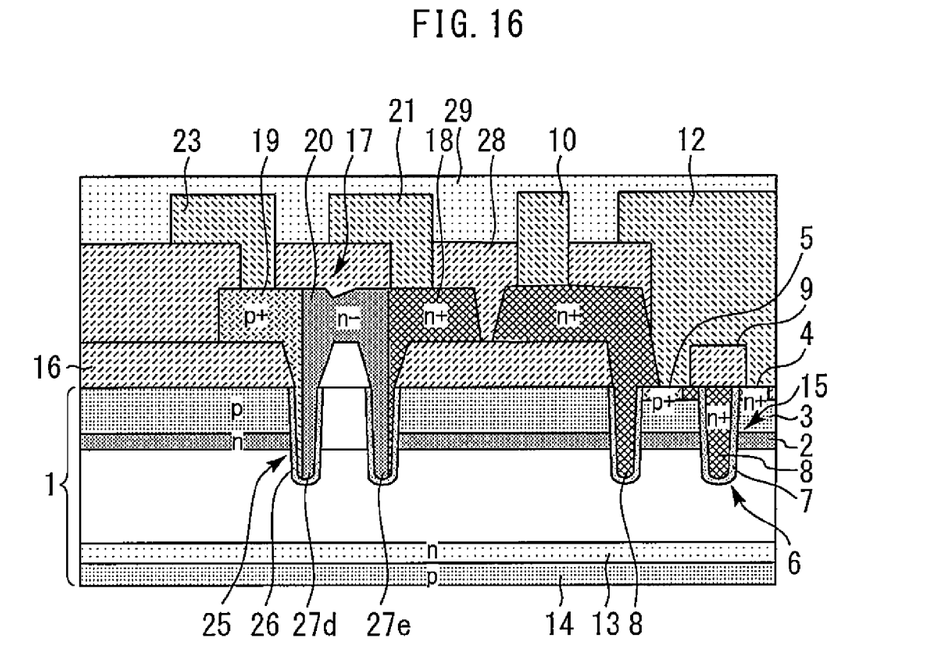
FIG. 16 is a cross-sectional view illustrating modification example 2 of the semiconductor device according to the third embodiment of the present invention.

FIG. 16 is a cross-sectional view illustrating modification example 2 of the semiconductor device according to the third embodiment of the present invention. The trench electrode 27 includes a trench electrode 27d located directly underneath a p⁺n⁻ junction between the p⁺-type layer 19 and the n⁻-type layer 20, and a trench electrode 27e located directly underneath an n⁻n⁺ junction between the n⁻-type layer 20 and the n⁺-type layer 18. The p⁺n⁻ junction extends into the trench electrode 27d and the n⁻n⁺ junction extends into the trench electrode 27e. This makes it possible to achieve effects of both the structure in FIG. 10 and the structure in FIG. 16.

Figure 17:
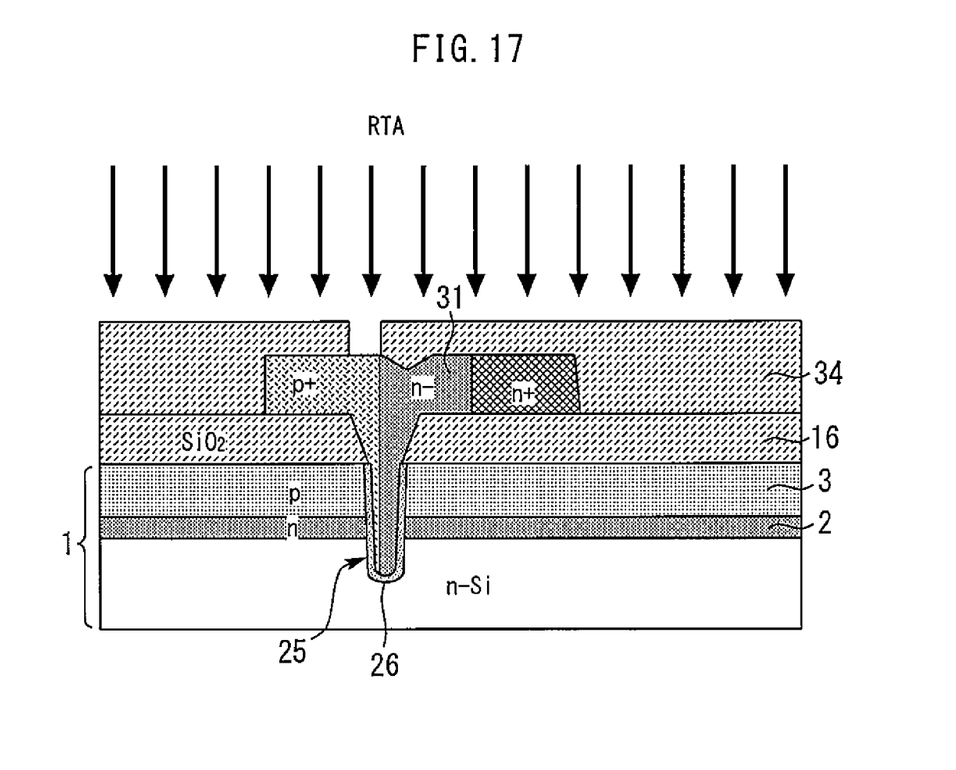
FIG. 17 is cross-sectional view illustrating a modification example of a method of manufacturing the semiconductor device according to the third embodiment of the present invention.

FIG. 17 is cross-sectional view illustrating a modification example of a method of manufacturing the semiconductor device according to the third embodiment of the present invention. An oxide film 34 that covers the oxide film 16 and the polysilicon film 31 is formed and an opening is formed in the junction. The polysilicon film 31 may also be locally subjected to RTA treatment using this oxide film 34 as a mask.

Note that the semiconductor substrate 1 is not limited to the one formed of silicon, but may also be formed of a wide band-gap semiconductor having a greater band gap than silicon. Examples of the wide band-gap semiconductor include silicon carbide, nitride-gallium-based material or diamond. Semiconductor devices formed using such a wide band-gap semiconductor have high withstand voltage and high allowable current density, and can thereby be downsized. Using downsized devices also allows semiconductor modules incorporating such devices to be downsized. Since the device has high heat resistance, it is possible to reduce the size of radiator fins of the heat sink and change the water-cooling part to an air-cooling one, and thereby further reduce the size of the semiconductor module. Furthermore, since the device has low power loss and high efficiency, it is possible to realize a highly efficient semiconductor module.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-113124, filed on May 29, 2013 including specification, claims, drawings and summary, on which the Convention priority of the present application is based, is incorporated herein by reference in its entirety.

What is claimed is:

1. A semiconductor device comprising:
a semiconductor substrate;
a first insulating film on a surface of the semiconductor substrate;
a temperature sensing diode on the first insulating film;
a trench extending inward from the surface of the semiconductor substrate; and
a trench electrode embedded in the trench via a second insulating film and connected to the temperature sensing diode.

2. The semiconductor device according to claim 1, wherein the temperature sensing diode and the trench electrode are made of polysilicon or amorphous silicon.

3. The semiconductor device according to claim 1, wherein the second insulating film is thinner than the first insulating film.

4. The semiconductor device according to claim 1, further comprising a semiconductor element on the semiconductor substrate,
wherein the semiconductor element is closer to the trench electrode than the temperature sensing diode.

5. The semiconductor device according to claim 1, wherein the temperature sensing diode includes an $n^+$-type layer, a $p^+$-type layer, and an $n^-$-type layer, and
the trench electrode is connected to the $n^+$-type layer.

6. The semiconductor device according to claim 1, wherein the temperature sensing diode includes an $n^+$-type layer, a $p^+$-type layer, and an $n^-$-type layer, and
the trench electrode is connected to the $p^+$-type layer.

7. The semiconductor device according to claim 1, wherein the temperature sensing diode includes an $n^+$-type layer, a $p^+$-type layer, and an $n^-$-type layer, and
the trench electrode is connected to the $n^-$-type layer.

8. The semiconductor device according to claim 5, wherein the trench electrode is formed integrally with the $n^+$-type layer.

9. The semiconductor device according to claim 6, wherein the trench electrode is formed integrally with the $p^+$-type layer.

10. The semiconductor device according to claim 7, wherein the trench electrode is formed integrally with the $n^-$-type layer.

11. The semiconductor device according to claim 1, wherein the temperature sensing diode includes an $n^+$-type layer, a $p^+$-type layer, and an $n^-$-type layer,
the trench electrode includes a first trench electrode formed integrally with the $n^+$-type layer, a second trench electrode formed integrally with the $p^+$-type layer, and a third trench electrode formed integrally with the $n^-$-type layer.

12. The semiconductor device according to claim 1, wherein the temperature sensing diode includes an $n^+$-type layer, a $p^+$-type layer, and an $n^-$-type layer,
the trench electrode is located directly underneath a $p^+n^-$ junction between the $p^+$-type layer and the $n^-$-type layer, and
the $p^+n^-$ junction extends into the trench electrode.

13. The semiconductor device according to claim 1, wherein the temperature sensing diode includes an $n^+$-type layer, a $p^+$-type layer, and an $n^-$-type layer,
the trench electrode is located directly underneath a $n^-n^+$ junction between the $n^-$-type layer and the $n^+$-type layer, and
the $n^-n^+$ junction extends into the trench electrode.

14. A manufacturing method of a semiconductor device comprising:
forming a first insulating film on a surface of a semiconductor substrate;
forming a trench extending inward from the surface of the semiconductor substrate;
forming a polysilicon film on the first insulating film and in the trench via a second insulating film, the polysilicon film including first and second areas separated each other with respect to the trench;
injecting a first impurity into the first area of the polysilicon film;
injecting a second impurity into the second area of the polysilicon film; and
locally subjecting a portion of the polysilicon film in the trench to RTA (rapid thermal annealing) treatment to cause the first and second impurities to diffuse in a depth direction of the trench and form a junction.

* * * * *